(12) United States Patent
Hwang et al.

(10) Patent No.: US 10,090,374 B2
(45) Date of Patent: Oct. 2, 2018

(54) ORGANIC LIGHT-EMITTING DISPLAY DEVICE

(71) Applicant: Samsung Display Co., LTD., Yongin-si, Gyeonggi-do (KR)

(72) Inventors: Sung Joo Hwang, Cheonan-si (KR); Gun Mo Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/916,550

(22) Filed: Jun. 12, 2013

(65) Prior Publication Data

US 2013/0334509 A1 Dec. 19, 2013

(30) Foreign Application Priority Data

Jun. 18, 2012 (KR) .................. 10-2012-0065057
Feb. 1, 2013 (KR) .................. 10-2013-0011934

(51) Int. Cl.
*H01L 27/32* (2006.01)
*G09G 3/3208* (2016.01)
*H01L 27/02* (2006.01)

(52) U.S. Cl.
CPC ....... *H01L 27/3297* (2013.01); *G09G 3/3208* (2013.01); *H01L 27/3223* (2013.01);
(Continued)

(58) Field of Classification Search
CPC .. G02F 1/136; G02F 1/1309; G02F 1/136204; G02F 1/13458; H01L 29/41733
See application file for complete search history.

(56) References Cited

U.S. PATENT DOCUMENTS 5,734,458 A * 3/1998 Ikubo et al. .................. 349/149
6,740,596 B2   5/2004 Hayase et al.
(Continued)

FOREIGN PATENT DOCUMENTS

EP   1213763 A2   6/2002
EP   2019432 A2   1/2009
(Continued)

OTHER PUBLICATIONS

English translation of TIPO Office Action dated Nov. 9, 2016, for corresponding Taiwanese Patent Application No. 102121506 (8 pages), previously submitted in an IDS on Dec. 6, 2016.
(Continued)

*Primary Examiner* — Jack Chen
(74) *Attorney, Agent, or Firm* — Lewis Roca Rothgerber Christie LLP

(57) ABSTRACT

Organic light-emitting display devices are provided. One organic light-emitting display device includes a substrate, a first wire on the substrate, a second wire insulated from and crossing the first wire, and a static electricity dispersion pattern insulated from and crossing the second wire. Another organic light-emitting display device includes: a substrate; a gate line and a data line on the substrate, insulated from and crossing each other; a dummy wire that is part of a same layer as one of the gate line or the data line, and having at least one end aligned with a sidewall of the substrate; a dummy intersection wire insulated from and crossing the dummy wire; and a static electricity dispersion pattern insulated from and crossing the dummy intersection wire.

32 Claims, 11 Drawing Sheets

(52) U.S. Cl.
CPC . *H01L 27/3276* (2013.01); *G09G 2300/0426* (2013.01); *G09G 2330/04* (2013.01); *G09G 2330/06* (2013.01); *H01L 27/0248* (2013.01); *H01L 2251/566* (2013.01)

(56) References Cited

U.S. PATENT DOCUMENTS

| | | | |
|---|---|---|---|
| 7,158,194 | B2 | 1/2007 | Lo et al. |
| 7,612,837 | B2 | 11/2009 | Lo et al. |
| 7,710,506 | B2 * | 5/2010 | Lee .................. G02F 1/136204 349/40 |
| 8,139,174 | B2 | 3/2012 | Lin et al. |
| 8,389,988 | B2 | 3/2013 | Yamazaki et al. |
| 9,130,067 | B2 | 9/2015 | Yamazaki et al. |
| 2002/0009890 | A1 | 1/2002 | Hayase et al. |
| 2003/0030054 | A1 * | 2/2003 | Hector et al. ................. 257/72 |
| 2005/0078232 | A1 * | 4/2005 | Lo .................... G02F 1/136204 349/40 |
| 2007/0023752 | A1 | 2/2007 | Nakamura |
| 2008/0074137 | A1 * | 3/2008 | Kim .................... G02F 1/13458 324/750.3 |
| 2009/0311824 | A1 | 12/2009 | Shin et al. |
| 2015/0362806 | A1 | 12/2015 | Yamazaki et al. |

FOREIGN PATENT DOCUMENTS

| | | |
|---|---|---|
| JP | 7-161939 | 6/1995 |
| JP | 7-230098 | 8/1995 |
| JP | 10-26750 | 1/1998 |
| JP | 2002-26333 A | 1/2002 |
| JP | 2007-188076 A | 7/2007 |
| JP | 2010-113346 A | 5/2010 |
| KR | 2007-0021669 A | 2/2007 |
| KR | 10-2007-0111226 | 11/2007 |
| KR | 2010-0123056 A | 11/2010 |
| KR | 2011-0049341 A | 5/2011 |
| KR | 2012-0017667 A | 2/2012 |
| TW | I229440 | 3/2005 |

OTHER PUBLICATIONS

JPO Office Action dated Oct. 18, 2016, for corresponding Japanese Patent Application No. 2013-124630 (6 pages).

TIPO Office Action dated Nov. 9, 2016, for corresponding Taiwanese Patent Application No. 102121506 (10 pages).

European Search Report dated Jul. 7, 2014 of the corresponding European Patent Application No. 13172565.7, noting listed references in this IDS (8 pages).

* cited by examiner

ORGANIC LIGHT-EMITTING DISPLAY DEVICE

This application claims priority to and the benefit of Korean Patent Application No. 10-2012-0065057, filed on Jun. 18, 2012 in the Korean Intellectual Property Office, and Korean Patent Application No. 10-2013-0011934 filed on Feb. 1, 2013 in the Korean Intellectual Property Office, the entire contents of all of which are incorporated herein by reference.

BACKGROUND

1. Field

Aspects of embodiments of the present invention relate to an organic light-emitting display device, such as an organic electroluminescent display device.

2. Description of the Related Art

An organic electroluminescent display device includes an organic light-emitting diode. Holes and electrons combine in an organic light-emitting layer of the organic light-emitting diode to form excitons. The organic light-emitting diode emits light due to energy generated when the excitons transit from an excited state to a ground state.

Organic electroluminescent display devices can be manufactured separately (such as one at a time, or one per substrate). However, for higher productivity, a plurality of organic electroluminescent display devices may be formed on one mother substrate, and the mother substrate then cut into separate organic electroluminescent display devices. In this case, test efficiency may deteriorate if panels of the organic electroluminescent display devices are tested after being separated from each other. Therefore, the panels of the organic electroluminescent display devices on the mother substrate may be tested in units of sheets before they are separated from each other.

The so-called "sheet unit wiring lines" are test wiring lines used to test the panels of the organic electroluminescent display devices in units of sheets. The sheet unit wiring lines remain in the organic electroluminescent display devices even after the mother substrate is cut. Static electricity may flow into the organic electroluminescent display devices through the sheet unit wiring lines, thereby damaging internal elements of the organic electroluminescent display devices.

For example, when a two-step cutting process is used to cut the mother substrate by forming a dummy space between every pair of adjacent organic electroluminescent display devices and then cutting the mother substrate twice between every pair of adjacent display devices (to remove the dummy space), a relatively small number of sheet unit wiring lines may remain in the organic electroluminescent display devices. However, when a one-step cutting process is used to cut the mother substrate by not forming the dummy space for production efficiency and then cutting mother substrate only once between every pair of adjacent display devices, a relatively large number of sheet unit wiring lines may remain in the organic electroluminescent display devices. This makes the organic electroluminescent display devices more susceptible to damage by electrostatic discharge.

SUMMARY

Aspects of embodiments of the present invention are directed toward an organic light-emitting display device, such as an organic electroluminescent display device. Further aspects of embodiments of the present invention are directed toward an organic electroluminescent display device that can be prevented from being damaged by electrostatic discharge (ESD) or that can significantly reduce ESD damage.

Aspects of embodiments of the present invention provide for an organic electroluminescent display device that can be prevented from being damaged by electrostatic discharge. Aspects of embodiments of the present invention also provide an organic electroluminescent display device that can be prevented from being damaged by electrostatic discharge even if a one-step cutting process is used to separate pairs of adjacent organic electroluminescent display devices on a mother substrate by cutting the mother substrate once between each of the pairs of adjacent display devices.

However, aspects of embodiments of the present invention are not restricted to those set forth herein. The above and other aspects of embodiments of the present invention will become more apparent to one of ordinary skill in the art to which the present invention pertains by referencing the detailed description of exemplary embodiments of the present invention given below.

According to an example embodiment of the present invention, an organic light-emitting display device is provided. The organic light-emitting display device includes a substrate, a first wire on the substrate, a second wire insulated from and crossing the first wire, and a static electricity dispersion pattern insulated from and crossing the second wire.

In some embodiments, the first wire has at least one end aligned with a sidewall of the substrate.

In some embodiments, a side surface of the at least one end of the first wire is in a same plane with the sidewall of the substrate.

In one embodiment, the side surface of the at least one end of the first wire is perpendicular to a surface of the substrate.

In one embodiment, the first wire is a dummy wire to which a driving signal is not transmitted.

In one embodiment, the at least one end of the first wire and the sidewall of the substrate are formed by a same cutting process.

In one embodiment, the substrate includes a display area and a non-display area, and the static electricity dispersion pattern is located in the non-display area.

In one embodiment, the static electricity dispersion pattern is separated from and not aligned with a sidewall of the substrate.

In one embodiment, the first wire and the static electricity dispersion pattern are part of a same layer.

In one embodiment, the static electricity dispersion pattern is rectangular and crosses the second wire at a plurality of spots.

In one embodiment, the display device further includes a semiconductor pattern insulated from and crossing the static electricity dispersion pattern.

In one embodiment, the semiconductor pattern includes a first side, a second side, a third side, and a fourth side, and one of the first through fourth sides is connected to another one of the first through fourth sides.

In one embodiment, the static electricity dispersion pattern and the semiconductor pattern cross each other on an outside of the second wire, the outside of the second wire being a direction closer to a sidewall of the substrate than to an interior of the substrate.

In one embodiment, the display device includes a conductive pattern layer connected to the semiconductor pattern.

In one embodiment, the conductive pattern layer is separated from the semiconductor pattern in one portion with an insulating layer interposed therebetween, and is connected to the semiconductor pattern in another portion by a contact in the insulating layer.

In one embodiment, the conductive pattern layer is part of a same layer as the second wire.

In one embodiment, the static electricity dispersion pattern, the insulating layer, the semiconductor pattern, and the conductive pattern layer constitute a thin-film transistor.

In another example embodiment of the present invention, an organic light-emitting display device is provided. The organic light-emitting display device includes: a substrate; a gate line and a data line on the substrate, insulated from and crossing each other; a dummy wire that is part of a same layer as one of the gate line or the data line, and having at least one end aligned with a sidewall of the substrate; a dummy intersection wire insulated from and crossing the dummy wire; and a static electricity dispersion pattern insulated from and crossing the dummy intersection wire.

In one embodiment, a side surface of the at least one end of the dummy wire is in a same plane with the sidewall of the substrate.

In one embodiment, the side surface of the at least one end of the dummy wire is perpendicular to a surface of the substrate.

In one embodiment, the at least one end of the dummy wire and the sidewall of the substrate are formed by a same cutting process.

In one embodiment, the static electricity dispersion pattern is separated from and not aligned with the sidewall of the substrate.

In one embodiment, dummy wire and the static electricity dispersion pattern are part of a same layer.

In one embodiment, the dummy intersection wire is part of a same layer as another one of the gate line or the data line.

In one embodiment, the display device further includes a semiconductor pattern insulated from and crossing the static electricity dispersion pattern.

In some embodiments, the display device further includes a conductive pattern layer connected to the semiconductor pattern.

In one embodiment, the conductive pattern layer is separated from the semiconductor pattern in one portion with an insulating layer interposed therebetween, and is connected to the semiconductor pattern in another portion by a contact in the insulating layer.

In one embodiment, the conductive pattern layer is part of a same layer as the dummy intersection wire.

In one embodiment, the static electricity dispersion pattern, the insulating layer, the semiconductor pattern, and the conductive pattern layer constitute a thin-film transistor.

In yet another example embodiment of the present invention, an organic light-emitting display device is provided. The organic light-emitting display device includes: a substrate; a first wire on the substrate; a second wire insulated from and crossing the first wire; a static electricity dispersion pattern insulated from and crossing the second wire, and shaped like a closed loop; and a semiconductor pattern insulated from and crossing the static electricity dispersion pattern.

In one embodiment, the display device further includes a conductive pattern layer separated from the semiconductor pattern in one portion with an insulating layer interposed therebetween, and connected to the semiconductor pattern in another portion by a contact in the insulating layer.

In one embodiment, the conductive pattern layer is part of a same layer as the second wire.

In one embodiment, the first wire has at least one end aligned with a sidewall of the substrate.

BRIEF DESCRIPTION OF THE DRAWINGS

The above and other aspects and features of the present invention will become more apparent by describing in detail example embodiments thereof with reference to the attached drawings, in which.

DETAILED DESCRIPTION

Figure 1:
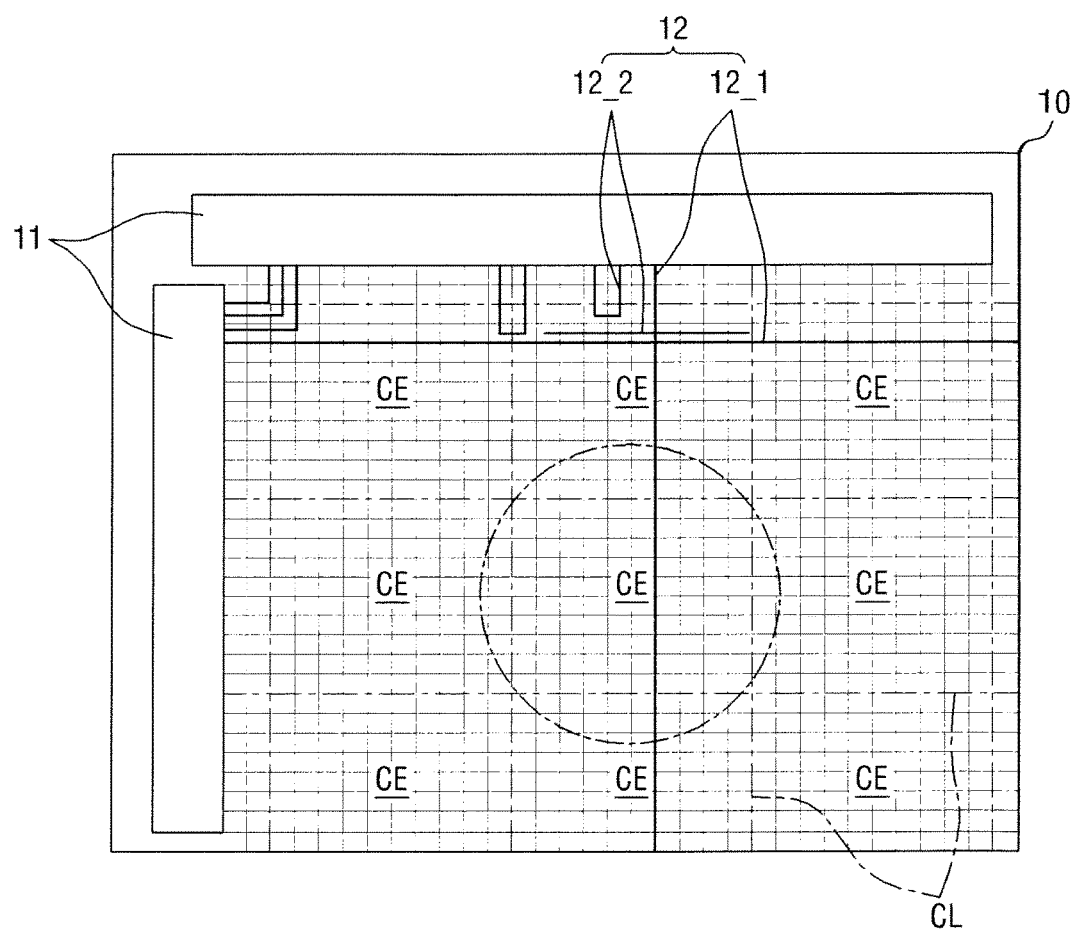
FIG. 1 is a conceptual diagram of a mother substrate of an organic light-emitting display device according to an embodiment of the present invention.

Aspects and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided to help fully convey concepts of the present invention to those skilled in the art, as defined by the appended claims. Thus, in some embodiments, well-known structures and devices are not shown in order not to obscure the description of the present invention with unnecessary detail. Like numbers refer to like elements throughout. In the drawings, the thickness of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of idealized schematic views of the present invention. Accordingly, the example views may be modified depending on manufacturing technologies and/or tolerances. Therefore, the embodiments of the present invention are not limited to those shown in the views, but include modifications in configuration formed based on manufacturing processes. Therefore, regions exemplified in figures have schematic properties, and shapes of regions shown in figures exemplify specific shapes of regions of elements and not limit aspects of the present invention.

Hereinafter, the present invention will now be described more fully with reference to the accompanying drawings, in which example embodiments of the invention are shown.

FIG. 1 is a conceptual diagram of a mother substrate 10 of an organic light-emitting display device according to an embodiment of the present invention. Referring to FIG. 1, the mother substrate 10 includes a plurality of cells CE. The cells CE are shown in FIG. 1 as being arranged in a matrix. In FIG. 1, the cells CE have substantially the same structure and size.

In FIG. 1, cutting lines CL are defined at each boundary between adjacent pairs of the cells CE, as well as at some of the boundaries formed at the edges of the matrix of cells CE. Each individual cell of the cells CE may be cut along the cutting lines CL adjacent to the individual cell to produce one organic light-emitting display device. In FIG. 1, a mother substrate driver 11 is formed on the periphery of the mother substrate 10. The cutting lines CL are also defined between the mother substrate driver 11 and each adjacent cell CE. In one embodiment, when cut along the cutting lines CL, the mother substrate driver 11 is separated and removed from each adjacent cell CE.

A plurality of signal wires 12 are formed on the mother substrate 10. Specific examples of the signal wires 12 include gate lines, data lines, power supply lines, and test wires. In FIG. 1, signal wires 12_1 (for example, gate lines and data lines) extend across a plurality of cells CE. However, some other signal wires 12_2 do not extend across pairs of adjacent cells CE. For example, ends of each signal wire 12_2 may be located within a particular cell CE, or the signal wire 12_2 may enter a particular cell CE from an extremity of the matrix of cells CE and then be bent to return in a direction in which it entered the particular cell CE.

In FIG. 1, at least some of the signal wires 12 are connected to the mother substrate driver 11. In one embodiment, the mother substrate driver 11 provides various electrical signals (voltages or currents) for testing or simulating the signal wires 12 or elements directly or indirectly connected to the signal wires 12. In one embodiment, the mother substrate driver 11 provides a test signal to the signal wires 12 in order to test the lighting of the cells CE connected to the signal wires 12 and to a plurality of pixels PX (see FIG. 2) included in the cells CE. In other embodiments, the mother substrate driver 11 provides test signals to the signal wires 12 in order to perform one or more of an aging test, a leakage current test, etc., on elements in each cell CE or pixel PX.

As an alternative or combined embodiment of the above-described mother substrate driver 11, a wiring pad unit that can transmit electrical signals using probes is provided on the periphery of the mother substrate 10.

A signal wire 12 extending from the mother substrate driver 11 or a certain cell CE to a neighboring cell CE is cut when the mother substrate 10 is cut along the cutting lines CL. Therefore, in some embodiments, a sidewall 110S (see FIGS. 4-5) of a substrate 110 (see FIG. 2) of a cut cell CE and an end of the cut signal wire 12 are substantially aligned with each other (for example, their ends or edges coincide or share a same plane).

In one embodiment, the mother substrate 10 is cut in a direction perpendicular to a surface thereof. Therefore, in the cut cell CE, the sidewall 110S of the substrate 110 is perpendicular to both surfaces of the substrate 110. Likewise, in some embodiments, the end of the cut signal wire 12 is perpendicular to both surfaces of the substrate 110 (as shown, for example, in FIGS. 4-6). Further, in one embodiment, the sidewall 110S of the substrate 110 and a surface of the end of the signal wire 12 lie in the same plane (as shown, for example, in FIG. 5).

Figure 2:
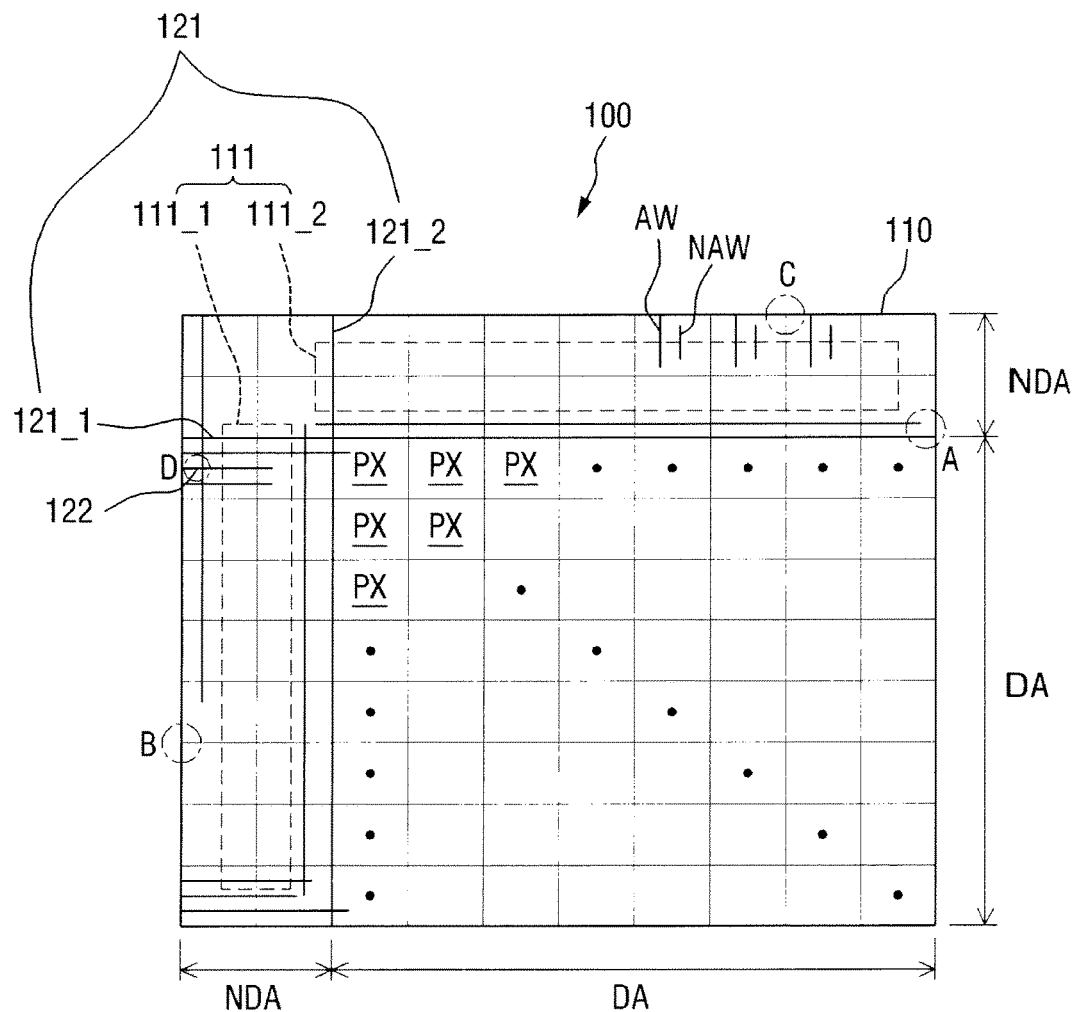
FIG. 2 is a schematic plan view of an organic light-emitting display device according to an embodiment of the present invention.
Figure 3:
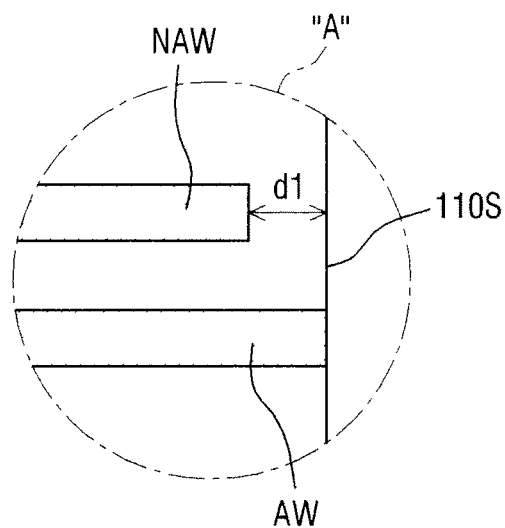
FIG. 3 is an enlarged view of a region A shown in FIG. 2.

FIG. 2 is a schematic plan view of an organic light-emitting display device 100 according to an embodiment of the present invention. Specifically, FIG. 2 is a plan view of an example organic light-emitting display device 100 corresponding to one cell CE obtained by cutting the mother substrate 10 of FIG. 1 along the cutting lines CL. FIG. 3 is an enlarged view of a region A shown in FIG. 2.

Referring to FIGS. 2 and 3, the organic light-emitting display device 100 includes the substrate 110 (cut from the mother substrate 10) in which a display area DA and a non-display area NDA are defined. As shown, a plurality of pixels PX is located in the display area DA. In FIG. 2, the pixels PX are arranged in a matrix. In some embodiments, each of the pixels PX represents any one of a plurality of colors. In one embodiment, each of the pixels PX is one of a red pixel, a green pixel, or a blue pixel. In some embodiments, the pixels PX further include a white pixel.

In some embodiments of the present invention, each of the pixels PX includes a light-emitting layer that emits light of a corresponding color. In one embodiment, the red pixels each include a red organic light-emitting layer, the green pixels each include a green organic light-emitting layer, and the blue pixels each include a blue organic light-emitting layer. In another embodiment, each of the pixels PX includes a white light-emitting layer, and a red, green, or blue color filter is installed on a light emission path.

In some embodiments, a non-display area NDA is located around the display area DA. In the drawings, the non-display area NDA is formed outside two neighboring sides of the rectangular display area DA. In other embodiments, the non-display area NDA is located outside only one side of the display area DA, or outside three or four sides of the display area DA.

In some embodiments, one or more drivers 111 are placed in the non-display area NDA. In FIG. 2, the drivers 111 include a gate driver 111_1 and a data driver 111_2. In one embodiment, the drivers 111 further include a driver IC that generates a driving signal and provides the generated driving signal or receives a driving signal and delivers the received driving signal. In another embodiment, a driver IC is mounted on an external substrate, such as a printed circuit board (PCB) or a flexible PCB (FPCB), and then connected to a pad unit provided in the driver 111.

A plurality of wires are placed (e.g., formed) on the substrate 110. The wires are made of a conductive material. In one embodiment, each of the wires is made of a single conductive layer. In other embodiments, some of the wires are made of a stack of multiple conductive layers.

Figure 4:
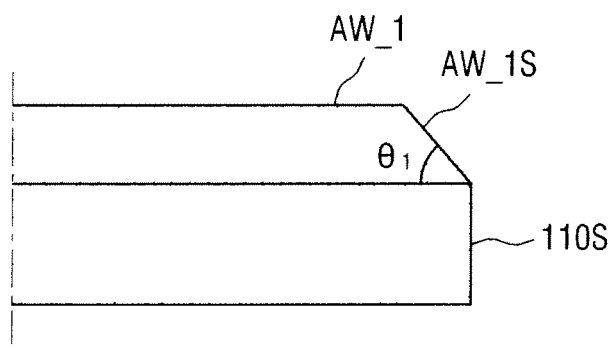
FIGS. 4 and 5 are cross-sectional views of substrate sidewall-aligned wires according to some embodiments of the present invention.
Figure 5:
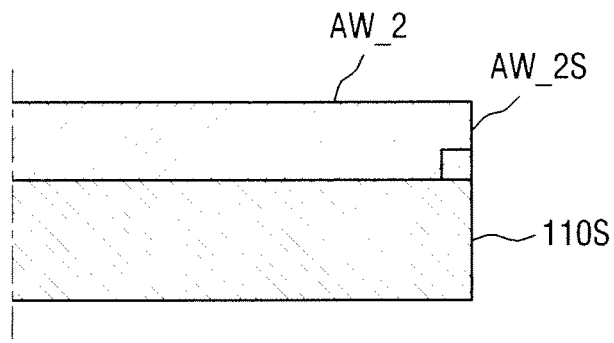

In FIG. 2, at least one end of each of some wires is aligned with (e.g., extends completely to) a sidewall 110S of the substrate 110 (see, e.g., FIGS. 4-5). These wires will be referred to as "substrate sidewall-aligned wires AW" in the present specification. At least one end of each substrate sidewall-aligned wire AW extends up to an edge of the substrate 110 as seen in a plan view.

Referring also to FIG. 1, each substrate sidewall-aligned wire AW on the mother substrate 10 extends toward a neighboring cell CE or the mother substrate driver 11. In FIG. 1, as the mother substrate 10 is cut along the cutting lines CL, an end of each substrate sidewall-aligned wire AW is aligned with the sidewall 110S of the substrate 110.

FIGS. 4 and 5 are cross-sectional views of substrate sidewall-aligned wires AW according to some embodiments of the present invention. Referring to FIG. 4, a side surface AW_1S of an end of a substrate sidewall-aligned wire AW_1 at least partially slopes at an acute angle $\theta_1$ to a surface of a substrate 110, and a lower end of the side surface AW_1 is aligned with a sidewall 110S of the substrate 110. Referring to FIG. 5, a side surface AW_2S of a substrate sidewall-aligned wire AW_2 is at a right angle to a surface of a substrate 110 and is substantially coplanar with a sidewall 110S of the substrate 110.

Referring also to FIG. 1, in some embodiments, if a wire is cut when the mother substrate 10 is cut along the cutting lines CL, an angle formed by a side surface AW_2S of an end of the wire AW_2 and a surface of the substrate 110 is equal to an angle formed by the sidewall 110S of the substrate 110 and the surface of the substrate 110 as shown in FIG. 5 (e.g., by cutting the wire AW_2 and the mother substrate 10 using the same cutting process). In one embodiment, the sidewall 110S of the substrate 110 and the side surface AW_2S of the end of the cut substrate sidewall-aligned wire AW_2 lie in the same plane.

Referring back to FIGS. 2 and 3, in some embodiments, ends of some other wires are not aligned with sidewalls 110S of the substrate 110. These wires will be referred to as "substrate sidewall-nonaligned wires NAW" in the present specification.

Figure 6:
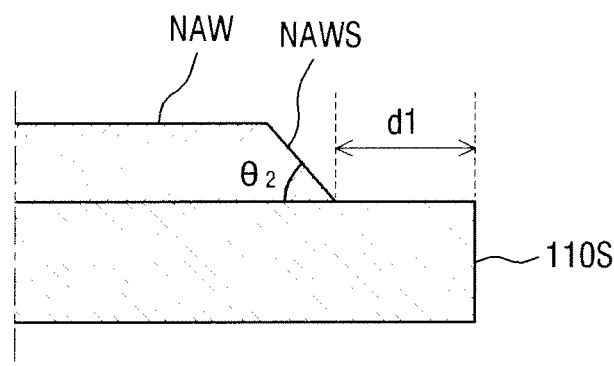
FIG. 6 is a cross-sectional view of a substrate sidewall-nonaligned wire according to some embodiments of the present invention.

FIG. 6 is a cross-sectional view of a substrate sidewall-nonaligned wire NAW according to some embodiments of the present invention. Referring to FIG. 6, an end of a substrate sidewall-nonaligned wire NAW is separated from a sidewall 110S of a substrate 110 by a set distance (such as a predetermined distance) d1. In one embodiment, a side surface NAWS of the end of the substrate sidewall-nonaligned wire NAW slopes at a set angle (such as a predetermined angle), e.g., an acute angle $\theta_2$ to a surface of the substrate 110.

When seen in a plan view, the ends of the substrate sidewall-nonaligned wires NAW stop short of extending up to edges of the substrate 110, that is, the wires NAW are separated from the edges.

Referring back to FIGS. 2 and 3, some wires formed on the substrate 110 are signal wires 121 that receive electrical signals and deliver the electrical signals to various elements such as pixels PX, electrodes in each pixel PX, and driver ICs. Some other wires are dummy wires 122 that are provided with signals when the substrate 110 is part of the mother substrate 10 but are not provided with signals (such as driving signals and test signals) after being cut. In one embodiment, the dummy wires 122 are floating wires that are floating from the signal wires 121.

In FIG. 2, the signal wires 121 include gate lines 121_1 and data lines 121_2. The gate lines 121_1 extend in a first direction X1, and the data lines 121_2 extend in a second direction X2 that intersects the first direction X1. In FIG. 2, the first direction X1 and the second direction X2 are orthogonal to each other. In a plan view, the gate lines 121_1 and the data lines 121_2 intersect each other. In some embodiments, the gate lines 121_1 and the data lines 121_2 are disposed on different layers with an insulating layer interposed therebetween. Therefore, the gate lines 121_1 and the data lines 121_2 are insulated from each other. Accordingly, the terms "intersect" and "intersection" will be used synonymously with "cross" and "crossing region," respectively, throughout the present application.

In FIG. 2, each pixel PX is located in a region defined by the intersection of neighboring gate lines 121_1, neighboring data lines 121_2, and edges of the substrate 110. By extension, each of all but the leftmost and topmost ones of the gate lines 121_1 and the data lines 121_2 extend along a boundary between neighboring pixels PX.

In some embodiments, each of the gate lines 121_1 and the data lines 121_2 is coupled to an electrode corresponding to an adjacent pixel PX. For example, each of the gate lines 121_1 is coupled to a gate electrode of a neighboring pixel PX. Further, each of the data lines 121_2 is coupled to a source electrode of a neighboring pixel PX. In one embodiment, these electrodes form thin-film transistors, for example, switching elements.

In one embodiment, each of the gate lines 121_1 and the data lines 121_2 extends from a side of the substrate 110 to an opposing side of the substrate 110. In some embodiments, each of the gate lines 121_1 and the data lines 121_2 includes a pad portion having an expanded width and located in the non-display area NDA, as illustrated further in FIGS. 7-8.

Figure 7:
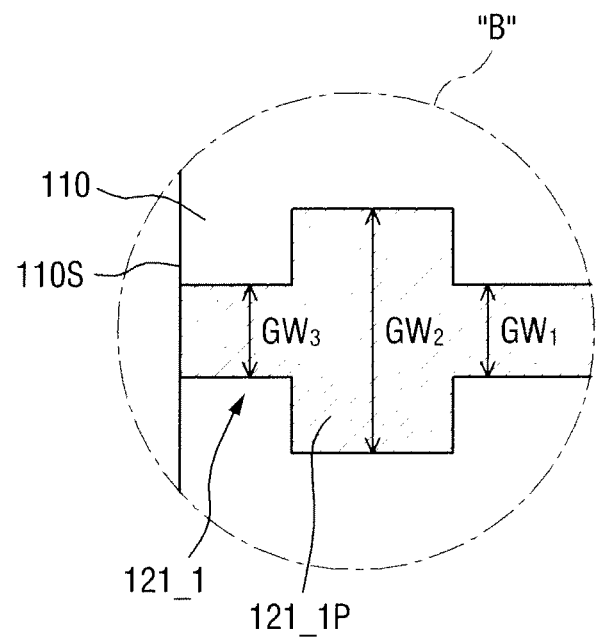
FIG. 7 is an enlarged view of a region B shown in FIG. 2.
Figure 8:
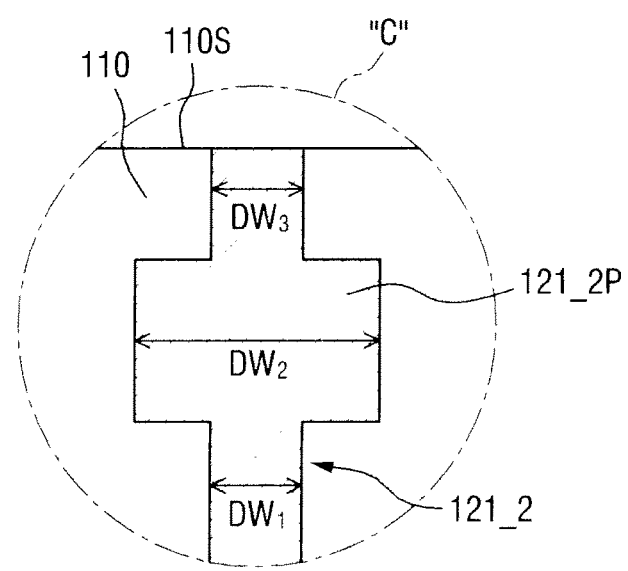
FIG. 8 is an enlarged view of a region C shown in FIG. 2.

FIG. 7 is an enlarged view of a region B shown in FIG. 2. FIG. 8 is an enlarged view of a region C shown in FIG. 2.

Referring to FIGS. 7 and 8, a gate line 121_1 and a data line 121_2 respectively include a gate pad portion 121_1P and a data pad portion 121_2P having greater widths GW2 and DW2 than widths GW1 and DW1 of the gate line 121_1 and the data line 121_2 in the display area DA. The gate line 121_1 and the data line 121_2 respectively extend up to corresponding sidewalls 110S of the substrate 110 via the gate pad portion 121_1P and the data pad portion 121_2P, such that an end of the gate line 121_1 and an end of the data line 121_2 are aligned with the sidewalls 110S of the substrate 110.

That is, in FIGS. 7-8, the gate line 121_1 and the data line 121_2 are substrate sidewall-aligned wires AW. In FIGS. 7-8, respective widths GW3 and DW3 of the ends of the gate line 121_1 and the data line 121_2 aligned with the sidewalls 110S of the substrate 110 are substantially equal to the widths GW1 and DW1 of the gate line 121_1 and the data line 121_2 in the display area DA, respectively. It should be noted that other embodiments are not so limited, and in some embodiments, the gate pad portion 121_1P and the data pad portion 121_2P are omitted.

Figure 9:
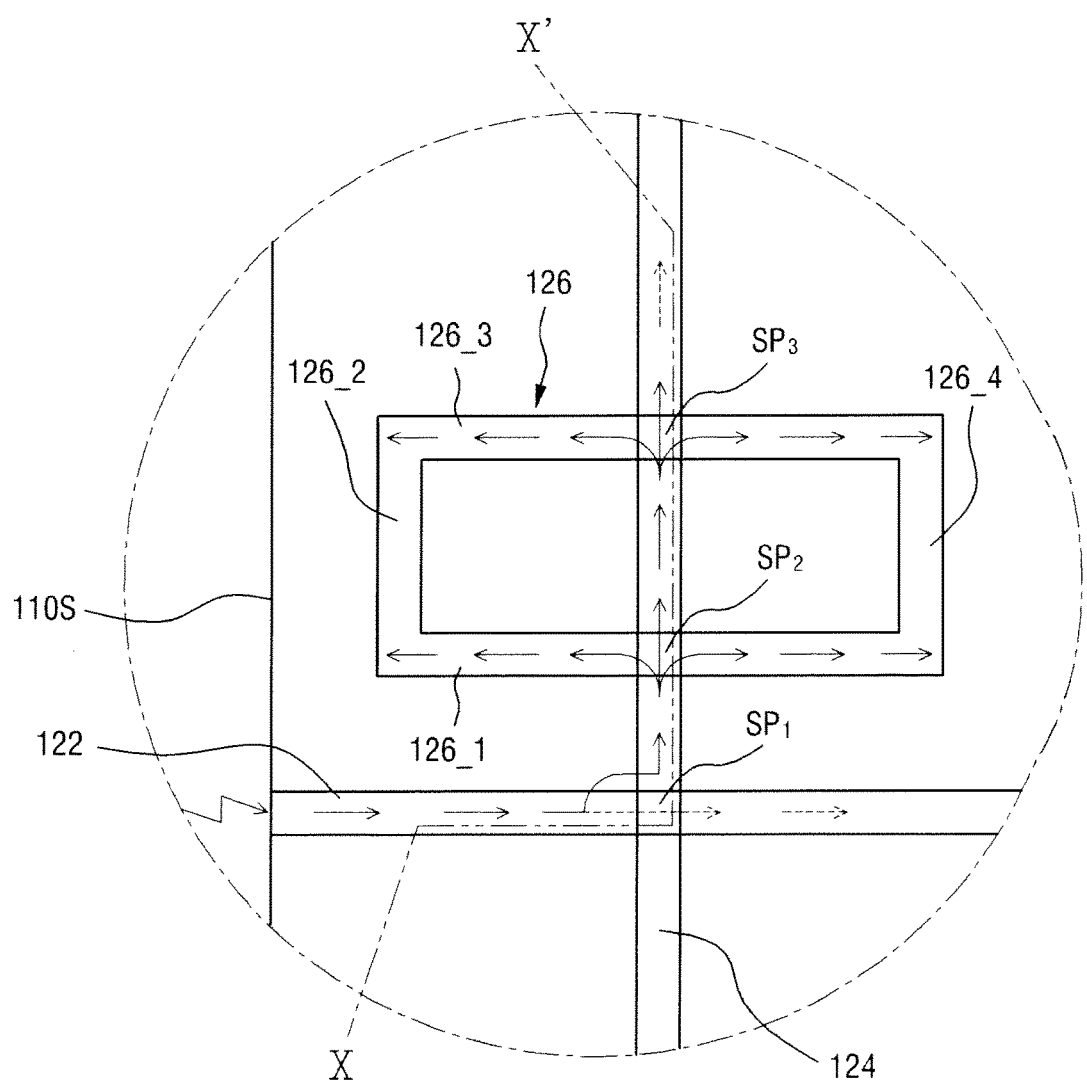
FIG. 9 is an enlarged view of a region D shown in FIG. 2.
Figure 10:
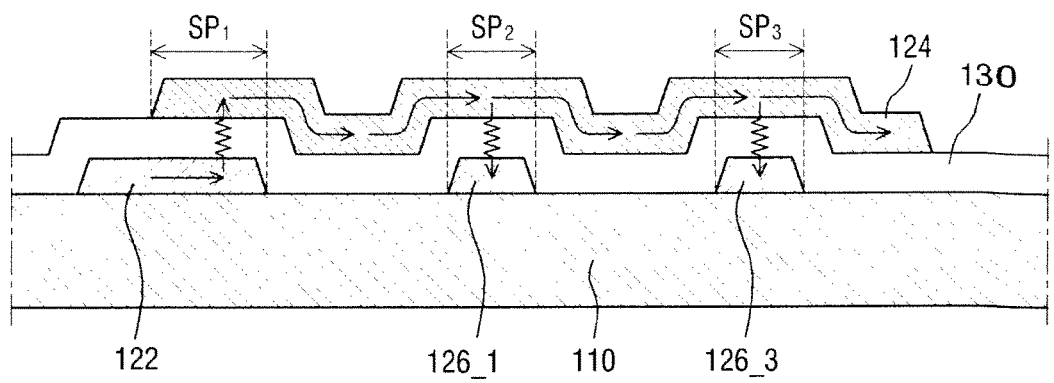
FIG. 10 is a cross-sectional view taken along the line X-X' of FIG. 9.

Example dummy wires and structures around the dummy wires will now be described in more detail with reference to FIGS. 9-16. FIG. 9 is an enlarged view of a region D shown in FIG. 2. FIG. 10 is a cross-sectional view taken along the line X-X' of FIG. 9. Referring to FIGS. 2, 9 and 10, an end of a dummy wire 122 is aligned with a sidewall 110S of the substrate 110. In some embodiments, a plurality of dummy wires 122 is formed on the substrate 110. In this case, at least some of the dummy wires 122 are substrate sidewall-aligned wires AW.

In FIG. 9, the dummy wire 122 extends from the sidewall 110S of the substrate 110 toward the inside of the substrate 110. In some embodiments, some dummy wires 122 extend up to the display area DA in which the pixels PX are located. In some embodiments, the dummy wire 122 is formed as part of the same layer as the gate lines 121_1 or the data lines 121_2, although the present invention is not limited to this case. In these embodiments, the dummy wire 122 is formed of the same material as the gate lines 121_1 or the data lines 121_2 and by the same process. In some embodiments, the dummy wire 122 has the same stacked structure as the gate lines 121_1 or the data lines 121_2.

In FIGS. 9-10, the dummy wire 122 intersects a dummy intersection wire 124 at at least one spot SP1 and is insulated from the dummy intersection wire 124. In one embodiment, the dummy intersection wire 124 is located in the non-display area NDA. In one embodiment, the dummy intersection wire 124 is formed as part of a different layer from the dummy wire 122. In FIG. 10, an insulating layer 130 is interposed between the dummy intersection wire 124 and the dummy wire 122.

In some embodiments, the dummy intersection wire 124 is a signal wire such as a gate line 121_1 or a data line 121_2. For example, in these embodiments, if the dummy wire 122 is formed as part of the same layer as the gate lines 121_1, the dummy intersection wire 124 is a data line 121_2. On the other hand, if the dummy wire 122 is formed as part of the same layer as the data lines 121_2, the dummy intersection wire 124 is a gate line 121_1. In an alternative embodiment, the dummy intersection wire 124 is another dummy wire to which signals are not transmitted.

In some embodiments, the dummy intersection wire 124 extends in the same direction as a direction in which the sidewall 110S (with which the dummy wire 122 intersecting the dummy intersection wire 124 is aligned) of the substrate 110 extends. In one embodiment, the sidewall 110S of the substrate 110 extends along the second direction X2, the dummy wire 122 extends from the sidewall 110S in the first direction X1 perpendicular to the second direction X2, and the dummy intersection wire 124 extends in the second direction X2.

In FIGS. 9-10, a static electricity dispersion pattern 126 is formed near the dummy wire 122. The static electricity dispersion pattern 126 is separated from the dummy wire 122. The static electricity dispersion pattern 126 intersects the dummy intersection wire 124 at one or more spots SP2 and SP3 and is insulated from the dummy intersection wire 124. The insulating layer 130 is interposed between the dummy intersection wire 124 and the static electricity dispersion pattern 126. In one embodiment, a plurality of dummy wires 122 are formed as substrate sidewall-aligned wires AW and static electricity dispersion patterns 126 are formed to correspond one-to-one to each of the dummy wires 122, although the present invention is not limited to this case.

In some embodiments, the static electricity dispersion pattern 126 is made of a conductive material. In one embodiment, the static electricity dispersion pattern 126 is formed as part of the same layer as the adjacent dummy wire 122 intersected by the dummy intersection wire 124. Further, the static electricity dispersion pattern 126 is formed of the same material as the dummy wire 122 and by the same process.

In some embodiments, the dummy wire 122 and the static electricity dispersion pattern 126 are formed of the same material as and as part of the same layer as the gate lines 121_1. In some of these embodiments, the dummy intersection wire 124 is a data line 121_2, a signal wire, or a dummy wire that extends in substantially the same direction as the direction in which the data lines 121_2 extend. In another embodiment, the dummy wire 122 and the static electricity dispersion pattern 126 are formed of the same material as and as part of the same layer as the data lines 121_2. In this case, the dummy intersection wire 124 is a gate line 121_1, a signal wire, or a dummy wire that extends in substantially the same direction as the direction in which the gate lines 121_1 extend.

In an example embodiment of a stacked structure, the dummy wire 122 and the static electricity dispersion pattern 126 are formed on the substrate 110, the insulating layer 130 covers the dummy wire 122 and the static electricity dispersion pattern 126, and the dummy intersection wire 124 is formed on the insulating layer 130.

In one embodiment, the static electricity dispersion pattern 126 is a substrate sidewall-nonaligned wire NAW that is not aligned with the sidewall 110S of the substrate 110. That is, the static electricity dispersion pattern 126 is separated from the sidewall 110S of the substrate 110 in a direction toward the inside of the substrate 110. In one embodiment, the static electricity dispersion pattern 126 is placed in the non-display area NDA. In some embodiments, the static electricity dispersion pattern 126 is separated from other signal wires or driver circuits, or is formed in a region with a low density of signal wires.

In FIG. 9, the static electricity dispersion pattern 126 is shaped like a closed curve (for example, a closed loop, such as a rectangle). In this case, the static electricity dispersion pattern 126 and the dummy intersection wire 124 are insulated from each other and intersect each other at a plurality of spots SP2 and SP3. The number of spots shown in the drawings is two.

In the example embodiment of FIG. 9, the static electricity dispersion pattern 126 is rectangular. A first side 126_1 and a third side 126_3 of the static electricity dispersion pattern 126 that face each other intersect the dummy intersection wire 124. A second side 126_2 of the static electricity dispersion pattern 126 is located outside the dummy intersection wire 124, and a fourth side 126_4 of the static electricity dispersion pattern 126 is located inside the dummy intersection wire 124. Here, the outside of the dummy intersection wire 124 denotes a direction closer to the sidewall 110S of the substrate 110 than to an interior of the substrate 110, and the inside of the dummy intersection wire 124 denotes a direction away from the sidewall 110S of the substrate 110, in other words, a direction toward a central part of the substrate 110.

In FIG. 9, the static electricity dispersion pattern 126 includes portions extending in substantially the same direction as a direction in which the dummy wire 122 extends. In FIG. 9, the first side 126_1 and the third side 126_3 extend in substantially the same direction as the direction in which the dummy wire 122 extends. Other wires extending in the same direction as the direction in which the dummy wire 122 extends are not interposed between the static electricity dispersion pattern 126 and the dummy wire 122 closest to the static electricity dispersion pattern 126.

In some embodiments, the static electricity dispersion pattern 126 includes one or more corner portions. The number of corner portions shown in the drawings is four. Each corner portion is relatively pointed to induce static electricity. In an example embodiment, an internal angle of at least one or all corner portions of the static electricity dispersion pattern 126 is a right angle or an acute angle.

A path along which static electricity flows in the organic light-emitting display device 100 described above will now be described. Referring to FIGS. 2, 9 and 10, the dummy wire 122 (i.e., a substrate sidewall-aligned wire AW) extends up to an edge of the organic light-emitting display device 100, and an end of the dummy wire 122 is aligned with the sidewall 110S of the substrate 110. Therefore, a side surface of the dummy wire 122 is exposed directly to the outside in this embodiment.

Static electricity may be generated outside the organic light-emitting display device 100 in various situations. For example, external static electricity may be generated when the organic light-emitting display device 100 is tested or packaged or while it is being in storage or used normally. Static electricity generated outside the organic light-emitting display device 100 can be introduced into the organic light-emitting display device 100. In this case, an external surface of the organic light-emitting display device 100 may be a start point from which the static electricity flows into the organic light-emitting display device 100. Static electricity is transmitted well through a conductive material. Therefore, of surfaces of the organic light-emitting display device 100, a surface made of a conductive material may serve as a main path through which static electricity is introduced into the organic light-emitting display device 100.

As described above, the dummy wire 122 (i.e., a substrate sidewall-aligned wire AW) is made of a conductive material, and a side surface thereof is exposed directly to the outside. Therefore, static electricity can be introduced into the organic light-emitting display device 100 through the dummy wire 122. In one embodiment, the static electricity introduced into the organic light-emitting display device 100 flows along the dummy wire 122. If the dummy wire 122 extends up to the display area DA, the static electricity may be transmitted to the display area DA. If the amount of static electricity transmitted to the display area DA is too large, elements of an adjacent pixel PX or signal wires can be damaged.

In one embodiment, a portion of the static electricity flowing along the dummy wire 122 is transmitted to the dummy intersection wire 124 at the spot SP1 at which the dummy intersection wire 124 intersects the dummy wire 122. As a result, the amount of static electricity flowing into the display area DA along the direction in which the dummy wire 122 extends is reduced, thereby reducing the damage to the elements of the adjacent pixel PX or the signal wires. The dummy wire 122 and the dummy intersection wire 124 are not electrically connected but are insulated from each other. However, in this embodiment, the static electricity of the dummy wire 122 jumps to the adjacent dummy intersection wire 124 at the spot SP1 at which the dummy wire 122 and the dummy intersection wire 124 are located closest to each other.

The static electricity jumping to the dummy intersection wire 124 flows along a direction in which the dummy intersection wire 124 extends. In one embodiment, when the static electricity flowing through the dummy intersection wire 124 reaches the spots SP2 and SP3 at which the dummy intersection wire 124 intersects the static electricity dispersion pattern 126, a portion of the static electricity jumps to the static electricity dispersion pattern 126. The static electricity jumping to the static electricity dispersion pattern 126 is dispersed along the directions in which the static electricity dispersion pattern 126 extends.

As a portion of the external static electricity is transmitted to the static electricity dispersion pattern 126, the amount of static electricity transmitted to the display area DA through the dummy wire 122 is reduced further, thereby reducing the damage to the display area DA. In some embodiments, the static electricity dispersion pattern 126 is located in the non-display area NDA and is separated from other signal wires or driver circuits, or is formed in a region with a low density of signal wires. Accordingly, even if static electricity is transmitted to the static electricity dispersion pattern 126, the effect of the static electricity on the entire organic light-emitting display device 100 is insignificant.

In one embodiment, the static electricity transmitted to the static electricity dispersion pattern 126 is concentrated in the corner portions of the static electricity dispersion pattern 126. In this case, the corner portions of the static electricity dispersion pattern 126 may melt or burn due to the concentration of energy. However, even if a portion of the static electricity dispersion pattern 126 is damaged, the damaged portion itself does not affect the display quality of the organic light-emitting display device 100. In addition, since the static electricity dispersion pattern 126 is located relatively far away from other elements, it does not directly affect the elements. Hence, the damaged portion is not a big problem. Rather, the static electricity dispersion pattern 126 is recognized by its ability to effectively dissipate strong external energy while minimizing the effect of the external energy on display quality.

Figure 11:
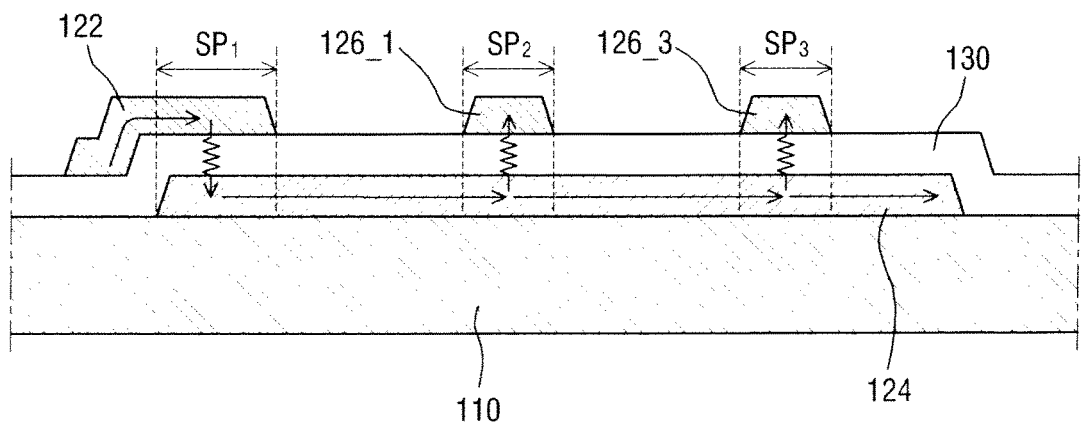
FIG. 11 is a partial cross-sectional view of an organic light-emitting display device according to another embodiment of the present invention.

FIG. 11 is a partial cross-sectional view of an organic light-emitting display device according to another embodiment of the present invention. FIG. 11 shows that an organic light-emitting display device can have various stacked structures other than the embodiment of FIG. 10 while having the same planar layout as the embodiment of FIG. 9. Referring to FIG. 11, in the organic light-emitting display device according to the current embodiment, a dummy intersection wire 124 is formed on a substrate 110, an insulating layer 130 covers the dummy intersection wire 124, and a dummy wire 122 and a static electricity dispersion pattern 126 are formed on the insulating layer 130. Other elements are substantially identical to those of the embodiment of FIG. 10, and thus a repetitive description thereof is not repeated.

Figure 12:
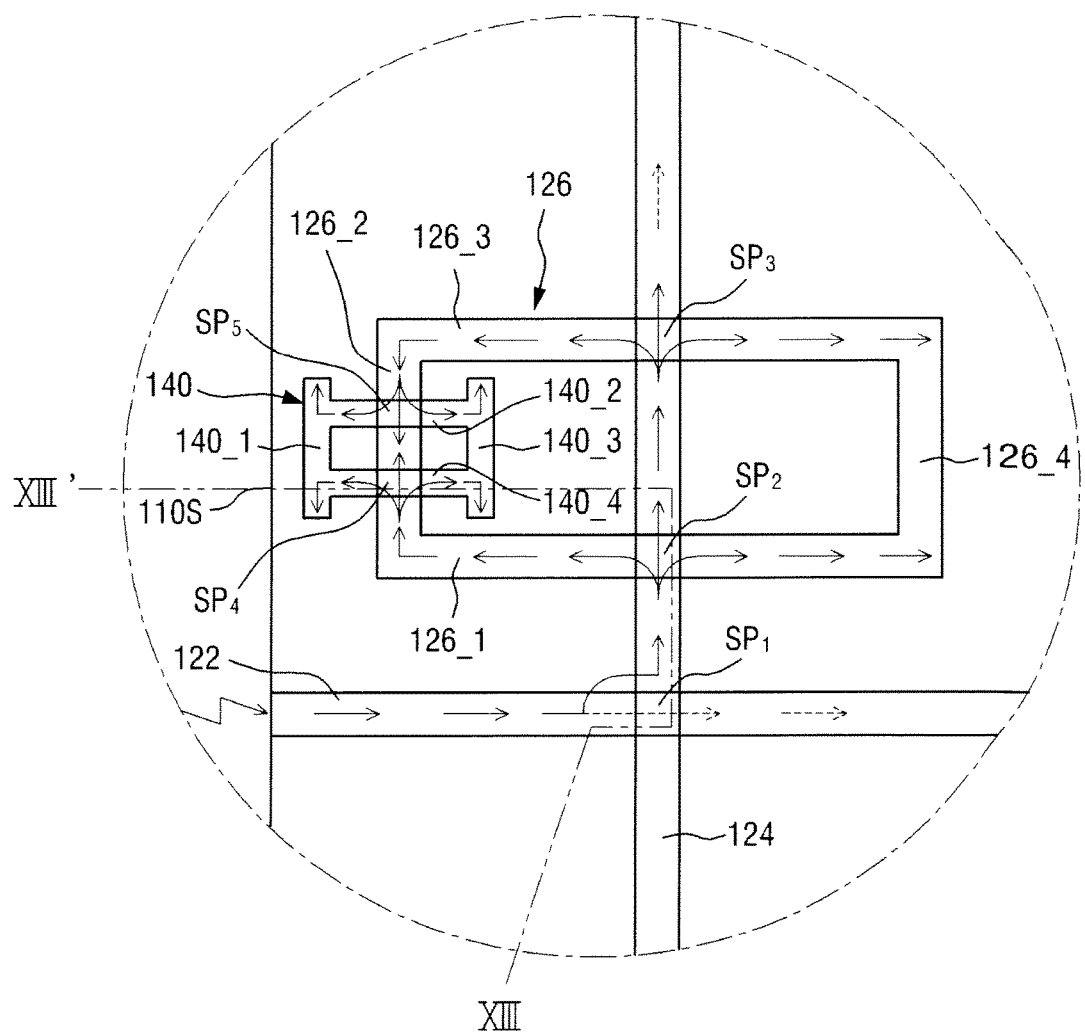
FIG. 12 is a schematic plan view of an organic light-emitting display device according to another embodiment of the present invention.
Figure 13:
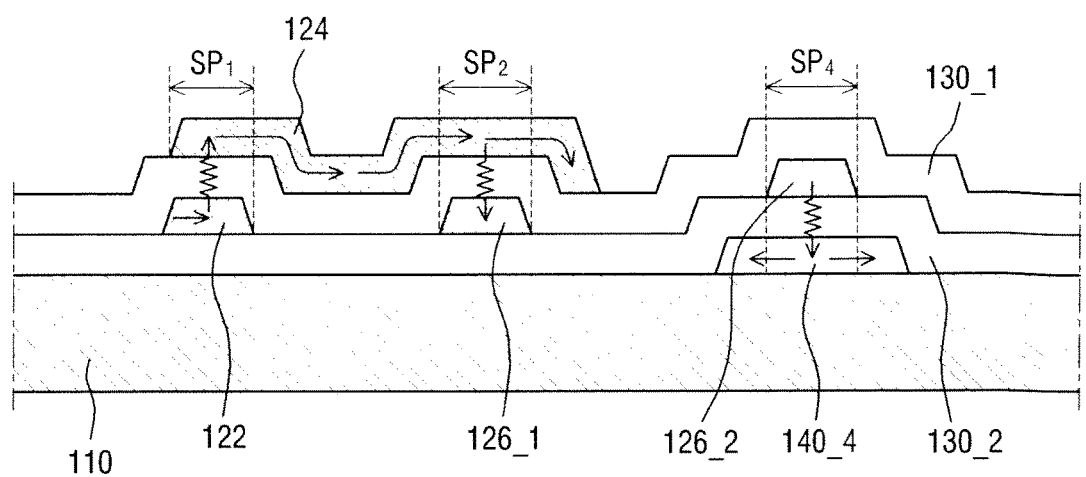
FIG. 13 is a cross-sectional view taken along the line XIII-XIII' of FIG. 12.

FIG. 12 is a schematic plan view of an organic light-emitting display device according to another embodiment of the present invention. FIG. 13 is a cross-sectional view taken along the line XIII-XIII' of FIG. 12.

Referring to FIGS. 12 and 13, the organic light-emitting display device according to the current embodiment is different from the embodiment of FIG. 9 in that it further includes a semiconductor pattern 140 overlapped by a static electricity dispersion pattern 126.

In FIGS. 12-13, the semiconductor pattern 140 is formed to intersect the static electricity dispersion pattern 126. In the current embodiment, the semiconductor pattern 140 intersects a second side 126_2 of the static electricity dispersion pattern 126 that is located outside a dummy intersection wire 124. However, the present invention is not limited to this case. In other embodiments, the semiconductor pattern 140 is formed to intersect a fourth side 126_4, a first side 126_1, or a third side 126_3 of the static electricity dispersion pattern 126. In some embodiments, two or more semiconductor patterns 140 that intersect different sides of the static electricity dispersion pattern 126 are formed. In some embodiments, two or more semiconductor patterns 140 that intersect one side of the static electricity dispersion pattern 126 are formed. In other embodiments, the above example numbers and positions of semiconductor patterns 140 are combined in various ways.

In some embodiments, the semiconductor pattern 140 includes at least one line having a set length (such as a predetermined length). In an example embodiment, the semiconductor pattern 140 includes a first side 140_1, a second side 140_2, a third side 140_3, and a fourth side 140_4. In this embodiment, any one of the first through fourth sides 140_1 through 140_4 is physically connected to another one. In the drawings, the semiconductor pattern 140 is substantially rectangular. However, the present invention is not limited to this shape, and in other embodiments, the semiconductor pattern 140 includes at least one line that intersects the static electricity dispersion pattern 126.

In FIG. 12, the fourth side 140_4 and the second side 140_2 of the semiconductor pattern 140 are parallel to each other and perpendicularly intersect the second side 126_2 of the static electricity dispersion pattern 126 at spots SP4 and SP5, respectively. The first side 140_1 and the third side 140_3 of the semiconductor pattern 140 are parallel to each other and substantially parallel to the dummy intersection wire 124. The first side 140_1 and the third side 140_3 of the semiconductor pattern 140 protrude from both sides of the fourth side 140_4 and the second side 140_2. The four protruding portions form substantially rectangular corner portions. In one embodiment, the corner portions relatively concentrate static electricity.

In some embodiments, the semiconductor pattern 140 is made of amorphous silicon, polycrystalline silicon, monocrystalline silicon, or an oxide semiconductor. In one embodiment, the semiconductor pattern 140 is made of the same material as the material that forms a channel region of a thin-film transistor in a pixel PX.

In FIG. 13, a first insulating layer 130_1 is interposed between the dummy intersection wire 124 and each of a dummy wire 122 and the static electricity dispersion pattern 126, and a second insulating layer 130_2 is interposed between the semiconductor pattern 140 and the static electricity dispersion pattern 126. The first insulating layer 130_1 is substantially identical to the above-described insulating layer 130 of FIGS. 10 and 11. In some embodiments, the second insulating layer 130_2 is made of a silicon oxide layer, a silicon nitride layer, a silicon oxynitride layer, or a stacked combination of these layers. In one embodiment, the second insulating layer 130_2 covers not only the semiconductor pattern 140 but also the whole surface of the substrate 110, although the present invention is not limited to this case. In this case, the dummy wire 122 and the static electricity dispersion pattern 126 are formed on the second insulating layer 130_2.

In an example embodiment, the first insulating layer 130_1 is made of the same material as an interlayer insulating film of a thin-film transistor in a pixel PX, and the second insulating layer 130_2 is made of the same material as a gate insulating layer of the thin-film transistor in the pixel PX.

In the current embodiment, external static electricity introduced through the dummy wire 122 is transmitted to the static electricity dispersion pattern 126 in substantially the same way as in the embodiment of FIG. 9. Further, in the current embodiment, a portion of the static electricity dispersed by the static electricity dispersion pattern 126 jumps to the semiconductor pattern 140 that intersects the static electricity dispersion pattern 126. Therefore, the static electricity is dispersed further. As a result, the amount of static electricity introduced into a display area DA through the dummy wire 122 is dispersed and reduced effectively. If the semiconductor pattern 140 is located in a non-display area NDA, even if static electricity is transmitted to the semiconductor pattern 140, the effect of the static electricity on the entire organic light-emitting display device is insignificant. That is, even if the semiconductor pattern 140 is damaged (e.g., burned) by the concentration of energy in the semiconductor pattern 140, the effect of the damaged semiconductor pattern 140 on the entire organic light-emitting display device is insignificant as described above.

In other embodiments, the semiconductor pattern 140 is replaced by a conductive pattern made of a conductive material. Even in this case, substantially the same static electricity dispersion mechanism applies.

Figure 14:
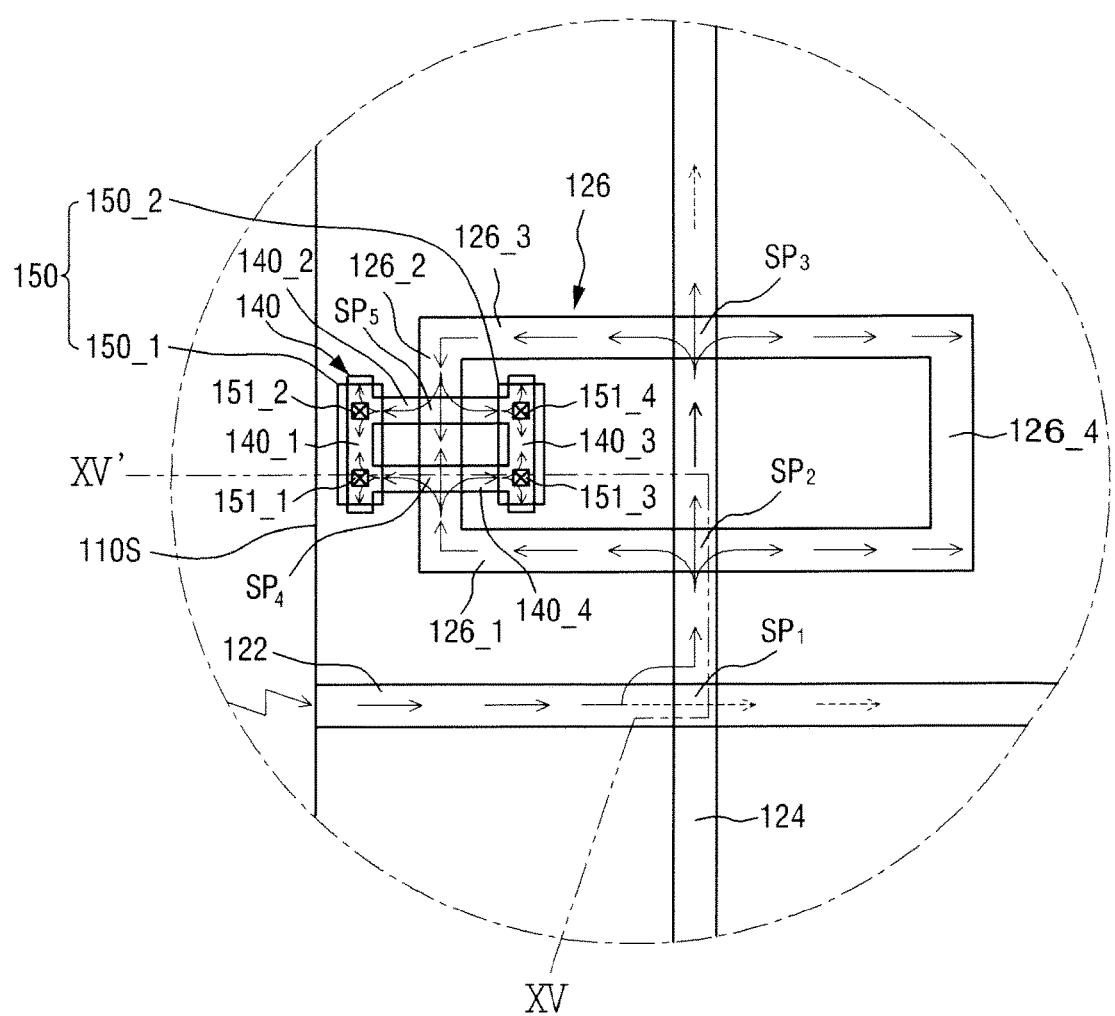
FIG. 14 is a schematic plan view of an organic light-emitting display device according to another embodiment of the present invention.
Figure 15:
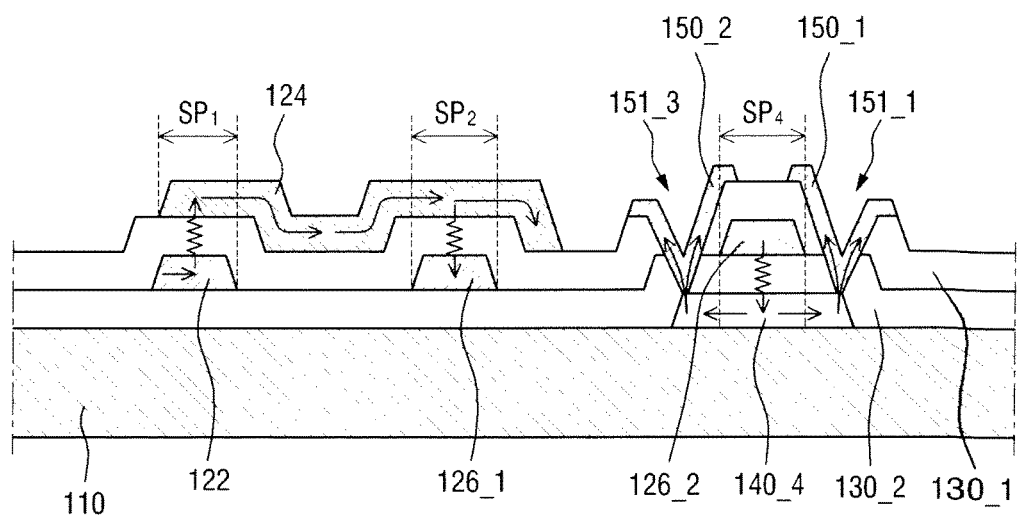
FIG. 15 is a cross-sectional view taken along the line XV-XV' of FIG. 14.

FIG. 14 is a schematic plan view of an organic light-emitting display device according to another embodiment of the present invention. FIG. 15 is a cross-sectional view taken along the line XV-XV' of FIG. 14.

Referring to FIGS. 14 and 15, the organic light-emitting display device according to the current embodiment is different from the embodiment of FIG. 12 in that it further includes a conductive pattern layer 150 electrically connected to a semiconductor pattern 140.

In FIGS. 14-15, the conductive pattern layer 150 is formed on a different layer from the semiconductor pattern 140. At least one insulating layer is interposed between portions of the conductive pattern layer 150 and the semiconductor pattern 140 (for example, those portions of the conductive pattern layer 150 not formed over contact holes that penetrate the at least one insulating layer to connect the conductive pattern layer 150 to the semiconductor pattern 140). In the example embodiment of FIG. 15, the at least one insulating layer between the conductive pattern layer 150 and the semiconductor pattern 140 is a first insulating layer 130_1 and a second insulating layer 130_2.

In FIG. 15, the conductive pattern layer 150 is formed as part of the same layer as a dummy intersection wire 124. In addition, the conductive pattern layer 150 is made of the same material as the dummy intersection wire 124.

In FIGS. 14-15, the conductive pattern layer 150 includes a first conductive pattern layer 150_1 that overlaps at least a portion of a first side 140_1 of the semiconductor pattern 140 and a second conductive pattern layer 150_2 that overlaps at least a portion of a third side 140_3 of the semiconductor pattern 140. The first conductive pattern layer 150_1 and the second conductive pattern layer 150_2 are physically separated from each other.

In FIG. 14, the first conductive pattern layer 150_1 and the second conductive pattern layer 150_2 extend in a direction substantially parallel to a direction in which the dummy intersection wire 124 extends. However, the present invention is not limited thereto.

Contacts 151_1 through 151_4 are formed in regions in which the conductive pattern layer 150 overlaps the semiconductor pattern 140. In FIGS. 14-15, the conductive pattern layer 150 and the semiconductor pattern 140 are electrically connected to each other by the contacts 151_1 through 151_4. The contacts 151_1 through 151_4 are formed by filling contact holes that penetrate the first insulating layer 130_1 and the second insulating layer 130_2 with a conductive material. In one embodiment, the material that forms the contacts 151_1 through 151_4 is identical to the material that forms the conductive pattern layer 150.

In one embodiment, contacts 151_1 through 151_4 represent contact holes 151_1 through 151_4 that penetrate the first insulating layer 130_1 and the second insulating layer 130_2, allowing the conductive pattern layer 150 to contact the semiconductor pattern 140. Thus, in one embodiment, the conductive pattern layer 150 is separated from the semiconductor pattern 140 in one portion with one or more insulating layers (such as first insulating layer 130_1 and second insulating layer 130_2) interposed therebetween, and is connected to the semiconductor pattern 140 in another portion by a contact (such as contacts 151_1 through 151_4) in the insulating layer.

In FIGS. 14-15, a static electricity dispersion pattern 126, the semiconductor pattern 140, and the conductive pattern layer 150 form a structure like a thin-film transistor.

In the current embodiment, external static electricity introduced through a dummy wire 122 is transmitted to the semiconductor pattern 140. Further, a portion of the static electricity transmitted to the semiconductor pattern 140 is transmitted to the conductive pattern layer 150 through the contacts 151_1 through 151_4. Therefore, since the static electricity is dispersed further to the conductive pattern layer 150, the amount of static electricity introduced into a display area DA through the dummy wire 122 is dispersed and reduced effectively. If the conductive pattern layer 150 is located in a non-display area NDA, even if static electricity is transmitted to the conductive pattern layer 150, the effect of the static electricity on the entire organic light-emitting display device is insignificant. That is, even if both ends of the conductive pattern layer 150 are damaged (e.g., burned) by the concentration of energy in the conductive pattern layer 150, the effect of the damaged conductive pattern layer 150 on the entire organic light-emitting display device is insignificant as described above.

Figure 16:
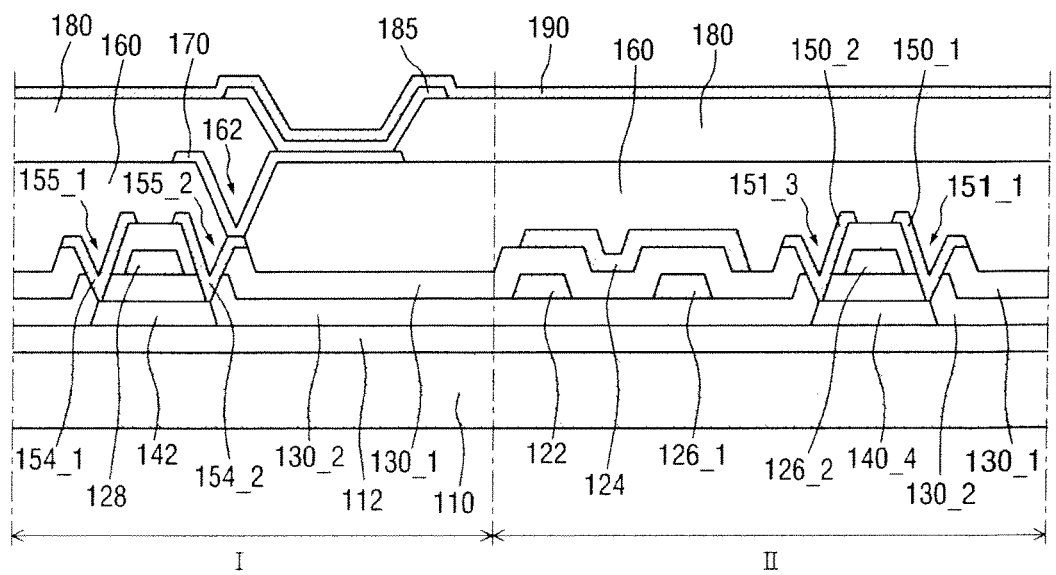
FIG. 16 is a cross-sectional view showing, for comparison purposes, a pixel area and a static electricity dispersion area of an organic light-emitting display device according to an example embodiment of the present invention.

FIG. 16 is a cross-sectional view showing, for comparison purposes, a pixel area I and a static electricity dispersion area II of an organic light-emitting display device according to an example embodiment of the present invention. In FIG. 16, the static electricity dispersion area II has substantially the same cross-sectional structure as FIG. 15. However, the present invention is not limited to this structure, and the structure of the static electricity dispersion area II can be replaced by any one of the above-described examples.

Referring to FIG. 16, a buffer layer 112 is formed on the whole surface of a substrate 110. In one embodiment, the buffer layer 112 prevents the diffusion of moisture or impurities coming from the substrate 110.

A semiconductor layer 142 is formed on the buffer layer 112 of a pixel area I, and a semiconductor pattern 140 (including a fourth side 140_4) is formed on the buffer layer 112 of a static electricity dispersion area II. In FIG. 16, the semiconductor layer 142 includes a channel region that is overlapped by a gate electrode 128, and source/drain regions that are highly doped with impurities and formed on both sides of the channel region. In FIG. 16, the gate electrode 128 of the pixel area I corresponds to the static electricity dispersion pattern 126 in the static electricity dispersion area II. In one embodiment, the semiconductor layer 142 and the semiconductor pattern 140 are made of a polysilicon layer formed by crystallizing, e.g., an amorphous silicon layer.

In FIG. 16, a second insulating layer 130_2 is formed on the semiconductor layer 142 and the semiconductor pattern 140. In one embodiment, the second insulating layer 130_2 is a gate insulating layer.

In FIG. 16, the gate electrode 128 is formed on the second insulating layer 130_2 in the pixel area I. The gate electrode 128 overlaps the semiconductor layer 142. In addition, a static electricity dispersion pattern 126 (including a first side 126_1 and a second side 126_2) and a dummy wire 122 are formed on the second insulating layer 130_2 of the static electricity dispersion area II. A portion of the static electricity dispersion pattern 126 overlaps the semiconductor pattern 140. In one embodiment, the gate electrode 128, the static electricity dispersion pattern 126, and the dummy wire 122 are formed as part of the same layer using the same material.

In FIG. 16, a first insulating layer 130_1 is formed on the gate electrode 128, the static electricity dispersion pattern 126, and the dummy wire 122. In one embodiment, the first insulating layer 130_1 is an interlayer insulating film.

In FIG. 16, a source electrode 154_1 and a drain electrode 154_2 are formed on the first insulating layer 130_1 of the pixel area I. In addition, a first conductive pattern layer 150_1 and a second conductive pattern layer 150_2 are formed on the first insulating layer 130_1 of the static electricity dispersion area II. The source electrode 154_1 and the drain electrode 154_2 are connected to the semiconductor layer 142 thereunder by contact holes 155_1 and 155_2 that penetrate the first insulating layer 130_1 and the second insulating layer 130_2. The first conductive pattern layer 150_1 and the second conductive pattern layer 150_2 are connected to the semiconductor pattern 140 thereunder by contact holes 151_1 and 151_3 that penetrate the first insulating layer 130_1 and the second insulating layer 130_2.

In FIG. 16, the source electrode 154_1 and the drain electrode 154_2 are formed as part of the same layer using the same material, and the first conductive pattern layer 150_1 and the second conductive pattern layer 150_2 are formed as part of this same layer using the same material.

In FIG. 16, a planarization layer 160 is formed on the source electrode 154_1, the drain electrode 154_2, the first conductive pattern layer 150_1, and the second conductive pattern layer 150_2.

A first electrode 170, which is a pixel electrode, is formed on the planarization layer 160 of the pixel area I. In FIG. 16, the first electrode 170 is connected to the drain electrode 154_2 by a contact hole 162 formed in the planarization layer 160.

In FIG. 16, a pixel defining layer 180 is formed on the first electrode 170. As shown, the pixel defining layer 180 exposes a portion of the first electrode 170. Further, an organic light-emitting layer 185 is disposed (e.g., placed or formed) on the first electrode 170 exposed by the pixel defining layer 180. In addition, a second electrode 190, which is a common electrode, is formed on the organic light-emitting layer 185. In FIG. 16, the second electrode 190 is also formed on the static electricity dispersion area II. In other embodiments, the second electrode 190 extends up to the static electricity dispersion area II.

In one embodiment, the first electrode 170 is an anode electrode, and the second electrode 190 is a cathode electrode. In another embodiment, the first electrode 170 is a cathode electrode, and the second electrode 190 is an anode electrode.

In one embodiment of a top emission organic light-emitting display device, the first electrode 170 is made of a reflective conductive layer, and the second electrode 190 is made of a transmissive conductive layer. In one embodiment of a bottom emission organic light-emitting display device, the first electrode 170 is made of a transmissive conductive layer, and the second electrode 190 is made of a reflective conductive layer.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting display device comprising:
    a substrate comprising a display area configured to emit light and a non-display area outside the display area;
    a plurality of gate lines in the display area and extending in a first direction;
    a plurality of data lines in the display area and extending in a second direction crossing the first direction; and
    a plurality of dummy wires in the non-display area, the dummy wires being floating wires insulated from the gate lines and the data lines and comprising:
        a first wire on the substrate and having at least one end aligned with a sidewall of the substrate;
        a continuous second wire insulated from and crossing the first wire;
        a static electricity dispersion pattern insulated from and crossing the continuous second wire at a plurality of separated spots along the continuous second wire; and
        an insulating layer disposed between the first wire and the second wire.

2. The display device of claim 1, wherein a side surface of the at least one end of the first wire is in a same plane with the sidewall of the substrate.

3. The display device of claim 2, wherein the side surface of the at least one end of the first wire is perpendicular to a surface of the substrate.

4. The display device of claim 1, wherein the at least one end of the first wire and the sidewall of the substrate are formed by a same cutting process.

5. The display device of claim 1, wherein the static electricity dispersion pattern is located in the non-display area.

6. The display device of claim 1, wherein the static electricity dispersion pattern is separated from and not aligned with the sidewall of the substrate.

7. The display device of claim 1, wherein the first wire and the static electricity dispersion pattern are part of a same layer.

8. The display device of claim 1, wherein the static electricity dispersion pattern is rectangular.

9. The display device of claim 1, wherein the dummy wires further comprise a semiconductor pattern insulated from and crossing the static electricity dispersion pattern.

10. The display device of claim 9,
    wherein the semiconductor pattern comprises a first side, a second side, a third side, and a fourth side, and
    wherein one of the first through fourth sides is connected to another one of the first through fourth sides.

11. The display device of claim 9, wherein the static electricity dispersion pattern and the semiconductor pattern cross each other on an outside of the second wire, the outside of the second wire being a direction closer to the sidewall of the substrate than to an interior of the substrate.

12. The display device of claim 9, wherein the dummy wires further comprise a conductive pattern layer connected to the semiconductor pattern at a first portion of the conductive pattern layer.

13. The display device of claim 12, further comprising an insulating layer separating the conductive pattern layer from the semiconductor pattern at a second portion of the conductive pattern layer, the insulating layer having a contact hole at the first portion of the conductive pattern layer to connect the conductive pattern layer to the semiconductor pattern.

14. The display device of claim 13, wherein the conductive pattern layer is part of a same layer as the second wire.

15. The display device of claim 14, wherein the static electricity dispersion pattern, the insulating layer, the semiconductor pattern, and the conductive pattern layer constitute a thin-film transistor.

16. The display device of claim 1, further comprising a plurality of pixels in the display area and defined by crossing regions of the gate lines and the data lines, each of the pixels comprising an organic light-emitting layer.

17. The display device of claim 1, wherein the static electricity dispersion pattern comprises a first area that overlaps the second wire and a second area that does not overlap the second wire.

18. An organic light-emitting display device comprising:
    a substrate comprising a display area configured to emit light and a non-display area outside the display area;
    a plurality of gate lines in the display area and extending in a first direction;
    a plurality of data lines in the display area and extending in a second direction crossing the first direction; and
    a plurality of dummy wires in the non-display area, the plurality of dummy wires being floating wires insulated from the gate lines and the data lines and comprising:
        a dummy wire that is part of a same layer as the gate fines or the data lines, extending in the first direction, and having at least one end aligned with a sidewall of the substrate;
        a dummy intersection wire extending in the second direction and insulated from and crossing the dummy wire;
        a static electricity dispersion pattern insulated from and crossing the dummy intersection wire at a plurality of separated spots disposed along the second direction; and
        an insulating layer disposed between the dummy wire and the dummy intersection wire.

19. The display device of claim 18, wherein a side surface of the at least one end of the dummy wire is in a same plane with the sidewall of the substrate.

20. The display device of claim 19, wherein the side surface of the at least one end of the dummy wire is perpendicular to a surface of the substrate.

21. The display device of claim 18, wherein the at least one end of the dummy wire and the sidewall of the substrate are formed by a same cutting process.

22. The display device of claim 18, wherein the static electricity dispersion pattern is separated from and not aligned with the sidewall of the substrate.

23. The display device of claim 18, wherein the dummy wire and the static electricity dispersion pattern are part of a same layer.

24. The display device of claim 18, wherein the dummy intersection wire is part of a same layer as the gate lines or the data lines.

25. The display device of claim 18, wherein the plurality of dummy wires further comprise a semiconductor pattern insulated from and crossing the static electricity dispersion pattern.

26. The display device of claim 25, wherein the plurality of dummy wires further comprise a conductive pattern layer connected to the semiconductor pattern at a first portion of the conductive pattern layer.

27. The display device of claim 26, further comprising an insulating layer separating the conductive pattern layer from the semiconductor pattern at a second portion of the conductive pattern layer, the insulating layer having a contact hole at the first portion of the conductive pattern layer to connect the conductive pattern layer to the semiconductor pattern.

28. The display device of claim 27, wherein the conductive pattern layer is part of a same layer as the dummy intersection wire.

29. The display device of claim 28, wherein the static electricity dispersion pattern, the insulating layer, the semiconductor pattern, and the conductive pattern layer constitute a thin-film transistor.

30. An organic light-emitting display device comprising:
a substrate comprising a display area configured to emit light and a non-display area outside the display area;
a plurality of gate lines in the display area and extending in a first direction;
a plurality of data lines in the display area and extending in a second direction crossing the first direction; and
a plurality of dummy wires in the non-display area, the dummy wires being floating wires insulated from the gate lines and the data lines and comprising:
a first wire on the substrate and having at least one end aligned with a sidewall of the substrate;
a second wire insulated from and crossing the first wire;
a static electricity dispersion pattern insulated from and crossing the second wire, and shaped like a closed loop with a hollow portion located at a center of the closed loop;
a semiconductor pattern insulated from and crossing the static electricity dispersion pattern; and
an insulating layer disposed between the first wire and the second wire.

31. The display device of claim 30,
wherein the dummy wires further comprise a conductive pattern layer connected to the semiconductor pattern at a first portion of the conductive pattern layer, and
wherein the display device further comprises an insulating layer separating the conductive pattern layer from the semiconductor pattern at a second portion of the conductive pattern layer, the insulating layer having a contact hole at the first portion of the conductive pattern layer to connect the conductive pattern layer to the semiconductor pattern.

32. The display device of claim 31, wherein the conductive pattern layer is part of a same layer as the second wire.

* * * * *